United States Patent [19]
Marchman et al.

[11] Patent Number: 5,656,182
[45] Date of Patent: Aug. 12, 1997

[54] PROCESS FOR FABRICATING A DEVICE IN WHICH THE PROCESS IS CONTROLLED BY NEAR-FIELD IMAGING LATENT FEATURES INTRODUCED INTO ENERGY SENSITIVE RESIST MATERIALS

[75] Inventors: Herschel Maclyn Marchman, New Providence; Anthony Edward Novembre, Union; Jay Kenneth Trautman, Chatham, all of N.J.

[73] Assignee: Lucent Technologies Inc., Murray Hill, N.J.

[21] Appl. No.: 391,905

[22] Filed: Feb. 21, 1995

[51] Int. Cl.$^6$ .................................................. B44C 1/22
[52] U.S. Cl. .................... 430/4; 430/30; 216/12; 216/85; 216/41
[58] Field of Search .................. 216/12, 41, 49, 216/59, 60, 84, 85; 156/626.1, 655.1, 656.1, 659.11, 662.1, 651.1; 430/4, 5, 296, 313, 434

[56] References Cited

U.S. PATENT DOCUMENTS

| | | | |
|---|---|---|---|
| 5,254,854 | 10/1993 | Betzig | 250/234 |
| 5,288,572 | 2/1994 | Konstantinos et al. | 430/30 |
| 5,288,998 | 2/1994 | Betzig et al. | 250/227 |
| 5,288,999 | 2/1994 | Betzig et al. | 250/227 |
| 5,498,579 | 3/1996 | Borodoovaky et al. | 437/250 |

OTHER PUBLICATIONS

Guerra, J. M., "Photon Tunneling Microscopy", Applied Optics, vol. 29, No. 26, pp. 3741–3752, (Sep. 10, 1990).
Adams, T. E., "Applications of Latent Image Metrology in Microlithography", SPIE, vol. 1464, Integrated Circuit Metrology, Inspection, and Process Colntrol V, pp. 294–303, (1991).

*Primary Examiner*—William Powell
*Attorney, Agent, or Firm*—R. J. Botos

[57] ABSTRACT

The present invention is directed to a process for device fabrication in which a spatially resolved latent image of latent features in an energy sensitive resist material is used to control process parameters. In the present process, an energy sensitive resist material is exposed to radiation using a patternwise or blanket exposure. An image of the latent effects of the exposure is obtained using a near-field imaging technique. This image of the latent effects of the exposure is used to control parameters of the lithographic process such as focus, lamp intensity, exposure dose, exposure time, and post exposure baking by comparing the image so obtained with the desired effects of the exposure and adjusting the relevant lithographic parameter to obtain the desired correlation between the image obtained and the desired effect. The image of the latent effects of exposure are also used to characterize the mask used in the lithographic process or to characterize the lithographic stepper used in the lithographic process.

7 Claims, 6 Drawing Sheets

DOSE 60mJ/cm²

DOSE 35mJ/cm²

DOSE 10mJ/cm²

DOSE 60mJ/cm²

DOSE 35mJ/cm²

DOSE 10mJ/cm²

PROCESS FOR FABRICATING A DEVICE IN WHICH THE PROCESS IS CONTROLLED BY NEAR-FIELD IMAGING LATENT FEATURES INTRODUCED INTO ENERGY SENSITIVE RESIST MATERIALS

BACKGROUND OF THE INVENTION

1. Technical Field

The present invention is directed to a process for device fabrication in which the process is controlled by inspecting the latent features introduced into an energy sensitive resist material.

2. Art Background

The advent of semiconductor devices and structures with submicron device rules has presented a need for more rigorous process control. In lithographic processes employed as a step in device fabrication (i.e. processes in which a desired pattern is introduced into an energy sensitive resist material via a patternwise exposure to energy, developed, and transferred into an underlying substrate) the process is controlled by generating a sample of the pattern, inspecting the pattern that is actually formed in the energy sensitive resist material, comparing the actual pattern in the sample to the desired pattern, and making the necessary adjustments to the process to make the actual pattern correspond more closely to the desired pattern. The problem associated with this technique is determining the parameter that must be adjusted so that the actual pattern corresponds acceptably to the desired pattern. The information obtained by inspecting the developed resist features does not provide a basis for real-time control of the lithographic process.

In lithographic processes, a discrepancy between the actual pattern and the desired pattern can result from a problem with the mask (i.e. the patterned reticle used to patternwise expose the energy sensitive resist material), a problem with the apparatus used to introduce the image in the energy sensitive resist material, or a problem with other materials and equipment used in the lithographic process. The act of inspecting the developed resist features does not pinpoint the source of the error if a greater-than-acceptable discrepancy is discovered between the desired pattern and the actual pattern.

In response to this problem, techniques have been developed for inspecting the latent features introduced into an energy sensitive material before that image is developed. One such technique is known as latent image metrology. By detecting a discrepancy between the latent image of the actual pattern and the desired pattern, one can more quickly pinpoint the source of that discrepancy. One such technique is described in Adams, T. E., "Applications of Latent Image Metrology in Microlithography", *Proc. SPIE* 1464, p. 294 (1991).

Adams describes a technique in which a latent image is introduced into an energy sensitive resist material and a portion of that latent image is subjected to white light which is scattered by the energy sensitive resist material. The latent image in the resist material affects the light in a way that provides information about the latent image. The scattered light is then detected. The amplitude of the detected signal is then used to evaluate the lithographic apparatus design, or adjust the exposure dose or focus used to introduce the image into the resist material. This evaluation is accomplished by analyzing the scattering amplitude as a function of the various image printing parameters.

This technique for evaluating a latent feature is limited because the classical diffraction limit for light is typically greater than 0.5 μm. Therefore, images of feature sizes that are less than 0.5 μm in size are difficult to detect accurately with this technique. Furthermore, to use this technique, a periodic array of features must be printed in the resist material. In a blanket exposure, however, the entire resist layer is exposed without features. This technique cannot be used to obtain meaningful information concerning a blanket exposure because there is an insufficient difference in scattering amplitude in a blanket exposure without features. Subtle differences in the blanket exposure caused by an uneven exposure or a less than uniform resist material will not be detected if a blanket exposure is examined using this technique.

SUMMARY OF THE INVENTION

The present invention is directed to a process for controlling at least one aspect of a lithographic process by inspecting energy sensitive resist materials that have been exposed to radiation. In the process of the present invention, an energy-sensitive resist material is exposed to radiation in either a blanket exposure or a patternwise exposure. The exposed energy-sensitive resist material is then inspected using near-field imaging. In near-field imaging, an image of an object is obtained by placing a signal light source very close (e.g. within 100 nm) to the surface of the imaged object. The image is obtained by observing the intensity of the light either transmitted through the sample or reflected from the sample. In images obtained using near-field imaging, resolution beyond the classical diffraction limit is obtained. Information from the near-field image is used to either control the lithographic process or to characterize the mask or the lithographic exposure tool used in the lithographic process. The lithographic parameters controlled by the present process include lamp intensity, focus, exposure dose, source coherence, and bake temperature.

In one embodiment of the present invention, the lithographic process is controlled by introducing a latent feature in an energy sensitive resist material, obtaining a spatially resolved image of that latent feature, and comparing that spatially resolved image with the desired pattern. A spatially resolved image in an image of the light either reflected from or transmitted through the sample as a function of position on the sample. A spatially resolved image yields information about the exposed energy-sensitive material that is not available by comparing the scattered intensity of light from various points on the surface of the exposed resist material. The image is a picture of the intensity of the light either reflected from or transmitted through a point on the sample relative to the intensity of the light either reflected from or transmitted through other points on the sample. An example of a spatially resolved image of an energy sensitive resist material is illustrated in FIG. 1. FIG. 1 is a grid pattern, with lines in the squares defined by the grid. FIG. 1 is an image of latent features in an energy sensitive resist material. Latent features are features which have been introduced into an energy sensitive material (by exposing the material to radiation, and, in some cases, baking the material) but which have not been developed. The dark and light areas in FIG. 1 are variations in intensity of light reflected from the various points on the resist material. The variations in intensity are caused by the variations in the topography and index of refraction of the resist material. These variations result, primarily from the patternwise exposure of the resist to radiation. These dark and light areas provide an image of the pattern introduced into the energy sensitive resist material.

In the present process, a substrate, typically a silicon wafer or a chrome-on-quartz reticle (i.e. mask), is coated with an energy sensitive resist material. The selection of a particular energy sensitive resist material depends upon the process. One skilled in the art is very familiar with the criteria for selecting a suitable resist material. These criteria include the type of exposing radiation (e.g. ultraviolet (UV) radiation, x-ray radiation, particle beams such as electron beams), the image feature size (if any), and the material into which the developed pattern is introduced. The thickness of the resist material that is applied on the substrate is also a matter of design choice and is not critical to practicing the present invention.

The energy sensitive resist material is then exposed to radiation using conventional means. The type of exposing radiation depends upon the process. For example, in processes for fabricating devices with design rules of 0.5 µm or less, the exposing radiation can be deep ultraviolet (deep UV) radiation, electron beam radiation, or x-ray radiation, among others. The resist material is typically patternwise exposed to radiation using a mask of the desired pattern, although other techniques such as direct write scanning are contemplated as useful.

After the resist material has been exposed to radiation, a spatially resolved image of the exposed resist material is obtained. The near field optical technique previously described is used to obtain the spatially resolved image. The light used to obtain the spatially resolved image has a wavelength above 6000 Å, and therefore does not affect the energy-sensitive resist material, which is sensitive to light of much smaller wavelength.

Apparatus for the near-field optical technique are known. One example is the near-field scanning optical microscope (NSOM) disclosed in U.S. Pat. No. 5,254,854 to Betzig. Another example is the photon tunneling microscope (PTM) that uses a membrane instead of a probe to create the near-field intensity that is described in Guerra, J. M. "Photon Tunneling Microscopy", Appl. Opt., 29, p. 3741 (1990), both of which are hereby incorporated by reference. If an NSOM apparatus is used, the latent image is scanned by a light emitting aperture near the apex of a sharp probe which is brought vertically to within at least about 10 nm from the surface of the resist material. A spatially resolved optical image with resolution beyond the classical diffraction limit is thereby obtained by focusing the collection optics onto the probe aperture.

If a PTM apparatus is used, a total internal reflection boundary is placed at the focal point of an objective lens with a numerical aperture (NA) greater than 1. A sample is placed within the photon-tunneling distance (about ¾ of a wavelength of the illuminating light) of the far side of the total internal reflection boundary. Light focussed in the total internal reflection boundary is reflected back and detected by the PTM. The amount of signal intensity on the far side of the boundary (called evanescent light) from the objective is observed from the change in reflected intensity. This decay is a function of the topography and the refractive index of the portion of the sample that is within the photon tunneling distance of the boundary. A spatially resolved image is obtained by observing the reflected intensity of the photons incident on the total internal reflection (TIR) boundary and mapping the intensity as a function of position across the field of view.

Once obtained, the spatially resolved image of the latent feature is used to characterize or control various aspects of the lithographic process. For example, a lithographic apparatus is characterized by exposing a portion of the energy sensitive resist to a uniform dose of radiation (a blanket exposure). A spatially resolved image of this exposed resist is obtained as described above. Theoretically, the image should reveal no variations in intensity of the light reflected from (or transmitted through) the sample as a result of this blanket exposure. If variations are observed, they are attributed to the exposure apparatus e.g. the lithographic tool (stepper or direct write apparatus). Similarly, if a spatially resolved image of a blanket exposure is compared with a spatially resolved image of a patterned exposure, the mask used to pattern the radiation can be characterized. Mask characterization is accomplished by observing the variations in the image of the blanket exposure. These variations are then subtracted from the image of the patterned exposure and the image of the patterned exposure is compared with the desired pattern. Differences between the image and the desired pattern are then attributed to the mask. The present invention is used to control the lithographic process by obtaining a correlation between a lithographic parameter such as exposure dose or bake time (if a baking step is included) of the resist and a spatially resolved image of the latent feature that resulted from that parameter. The latent features are then developed, and another correlation is obtained between the developed feature and the spatially resolved image of that feature before it was developed. The latent feature that corresponded to the desired developed feature is selected, and the lithographic parameter is controlled by monitoring the latent image. For example, once a correlation between exposure dose and latent image is obtained, the process is controlled by monitoring the latent image of the resist during exposure, and halting exposure when the latent feature corresponds to the desired feature. This technique is not affected by variations in lamp intensity, because the exposure is only halted when the desired latent feature is obtained. This technique can therefore be used to compensate for lamp input.

Because the technique for generating a spatially resolved latent image is non-destructive, it is contemplated that, if desired, a spatially resolved image will be generated after each processing step to characterize that particular processing step. For example, a spatially resolved image will be obtained after the exposure step to select the desired exposure conditions. A second spatially resolved image will be obtained after the post exposure bake step to determine the post exposure bake conditions that provide the image from which the desired pattern is obtained.

DETAILED DESCRIPTION

Figure 2:
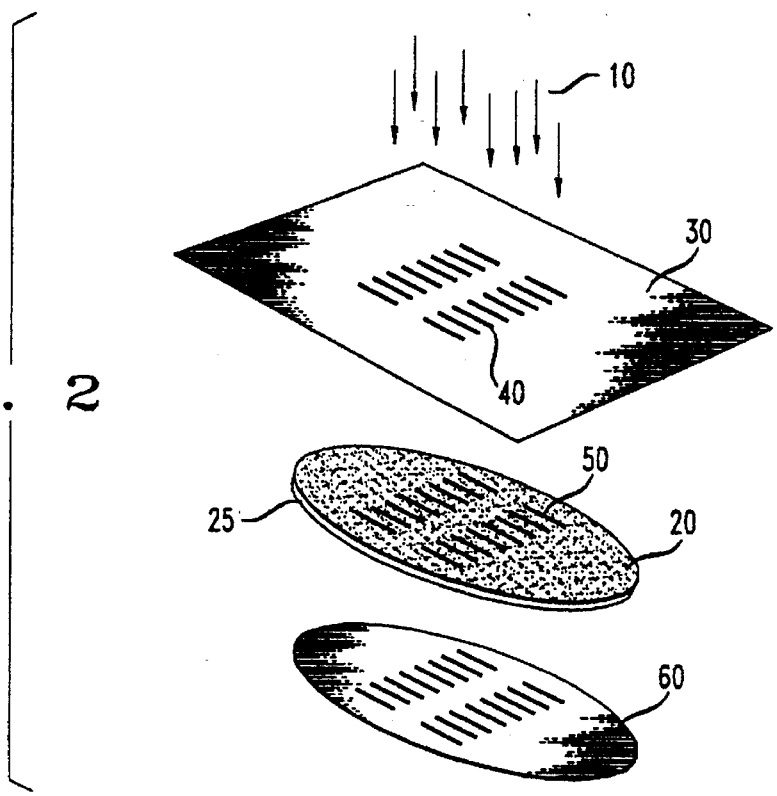
FIG. 2 is a flow diagram of a lithographic process.

In the present process a spatially resolved image of an energy sensitive resist material that has been exposed to radiation is obtained and used to control various aspects of a lithographic process. A typical lithographic process is illustrated in FIG. 2. Exposing radiation 10 is directed toward a layer of energy sensitive resist material 20 formed on a substrate. Although the entire layer of energy sensitive resist material 20 may be exposed to the radiation (this is known as a blanket exposure), more typically the resist material is patternwise exposed to radiation. One way to effect the desired patternwise exposure is to interpose a mask 30 between the source of exposing radiation and the energy sensitive resist material 20. The lines 40 in the mask 30 are apertures through which the radiation passes to the energy sensitive resist material 20. The lines 40 in the mask 30 correspond to the lines 50 in the resist 20. Each of the lines 50 in the energy sensitive resist material is a latent feature. The radiation causes a change in the energy sensitive resist material that is exposed to it. This change is either a chemical change and/or a structural change. These changes typically cause the refractive index of the material to change. Typically, the chemical change and/or structural change is exploited to develop the pattern 60 that corresponds to the image 50.

The present process is used in conjunction with lithographic processes for device fabrication. The materials and conditions used to introduce the latent image of a pattern in an energy sensitive resist material are those that are typically used in processes for device fabrication. One skilled in the art is capable of selecting the appropriate materials and conditions for a particular application. Since the process provides particular advantages in processes for device fabrication wherein the design rules for the device are 0.5 μm or less, the exposing radiation will typically be UV, x-ray radiation, or electron beam radiation. The energy sensitive resist materials selected are those that are suitably sensitive to this radiation.

Figure 3:
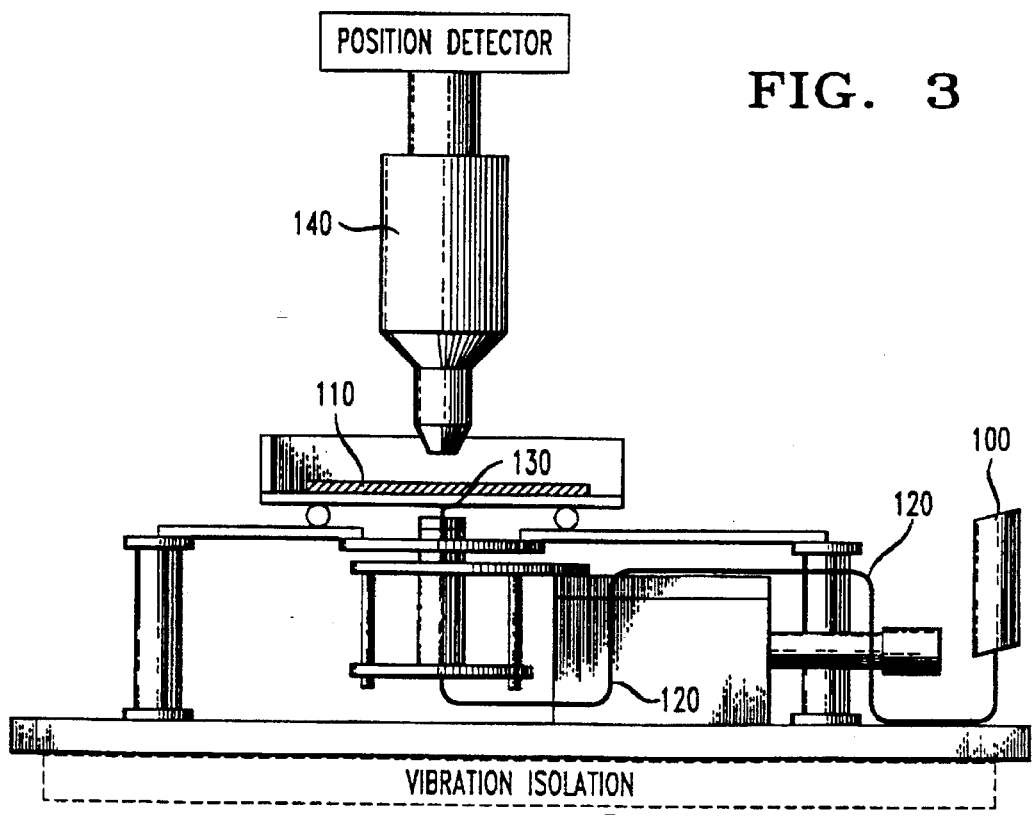
FIG. 3 is a schematic illustration of an NSOM apparatus in the transmission mode as it is used in the present process.

After the image is introduced into the energy sensitive resist material, a spatially resolved image of the latent feature or features in the energy sensitive material is obtained. The spatially resolved image is obtained using near-field optical instruments such as the NSOM and PTM previously described. FIG. 3 is a schematic illustration of an NSOM apparatus that is contemplated as useful in the present process. The NSOM apparatus is configured for use in the transmission mode (i.e. the sample is scanned on one side of the wafer and the optical microscope collects the light transmitted through the sample). In the transmission mode, light with a wavelength of about 6328 Å from a laser is introduced onto the sample. Typically, the sample is a layer of energy sensitive resist material that has been patternwise exposed to radiation. The light is transmitted through an optical fiber 120 and through a probe 130 which is positioned within the near-field distance (e.g. 100 nm or less) from the surface of the sample 110. The probe 130 and the sample 110 are mounted so that they are movable relative to each other. The apparatus used to effect these movements is described in U.S. Pat. No. 5,288,998 to Betzig which is incorporated by reference into this disclosure. The light transmitted through the sample is detected using the optical microscope 140. The intensity of light at each point on the sample is mapped to obtain an image of intensity as a function of position. This image is then used to control and characterize the lithographic process according to the present invention.

Figure 4:
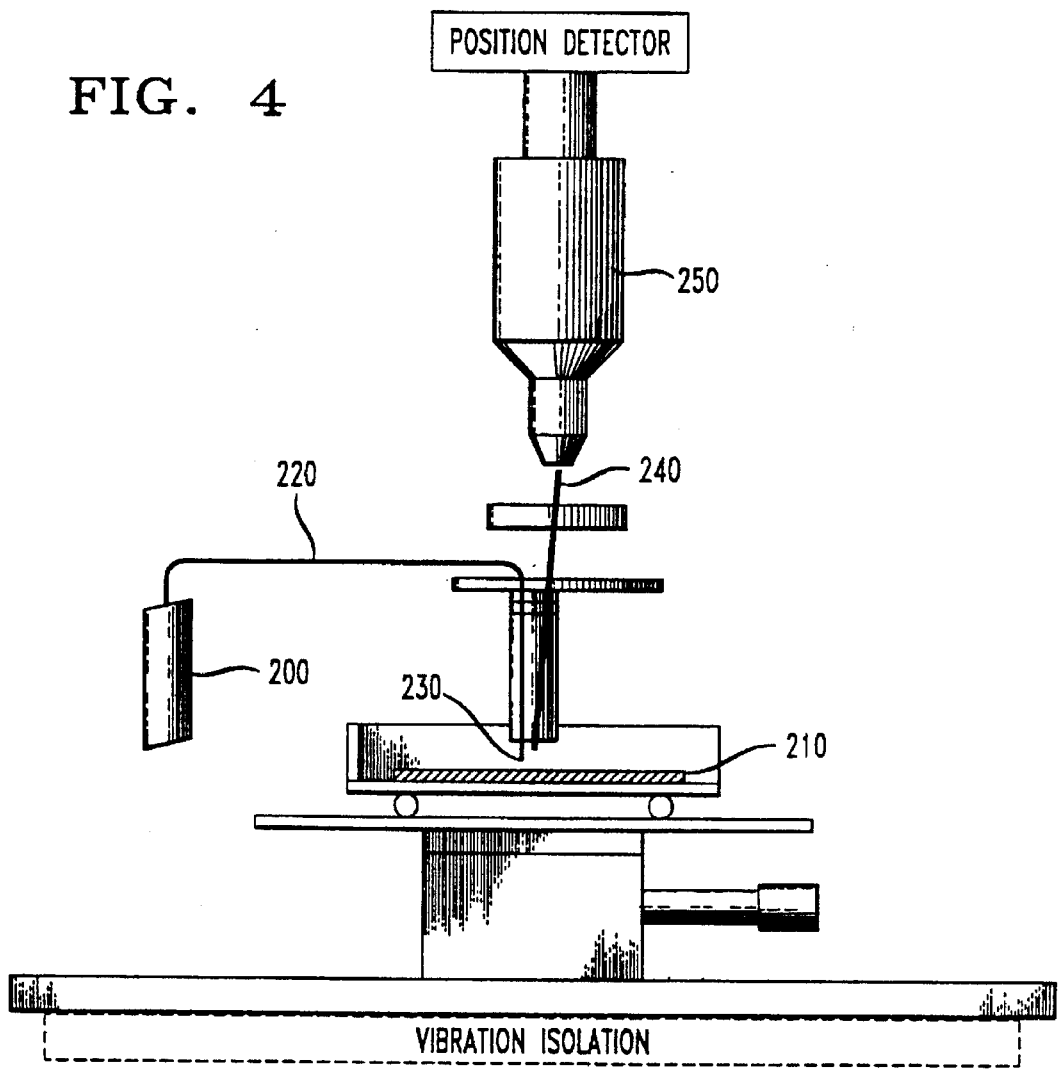
FIG. 4 is a schematic illustration of an NSOM apparatus in the reflection mode as it is used in the present process.

FIG. 4 is a schematic illustration of an NSOM apparatus that is configured in the reflectance mode (i.e. light introduced onto the sample from a laser is reflected from the sample, e.g. an energy-sensitive resist material formed on a substrate, and collected by the microscope). In the reflectance mode, light from a laser 200 as described above is introduced onto the resist-coated surface of the sample 210 via an optical fiber 220 and probe 230 as described above. The sample and probe are moved relative to each other as described above. The light is reflected from the sample using an optical fiber probe 240 and transmitted to a detector provided by the optical microscope 250. The spatially resolved image is obtained as described above, by mapping the intensity of the light reflected from the sample as a function of the position on the sample.

Figure 5:
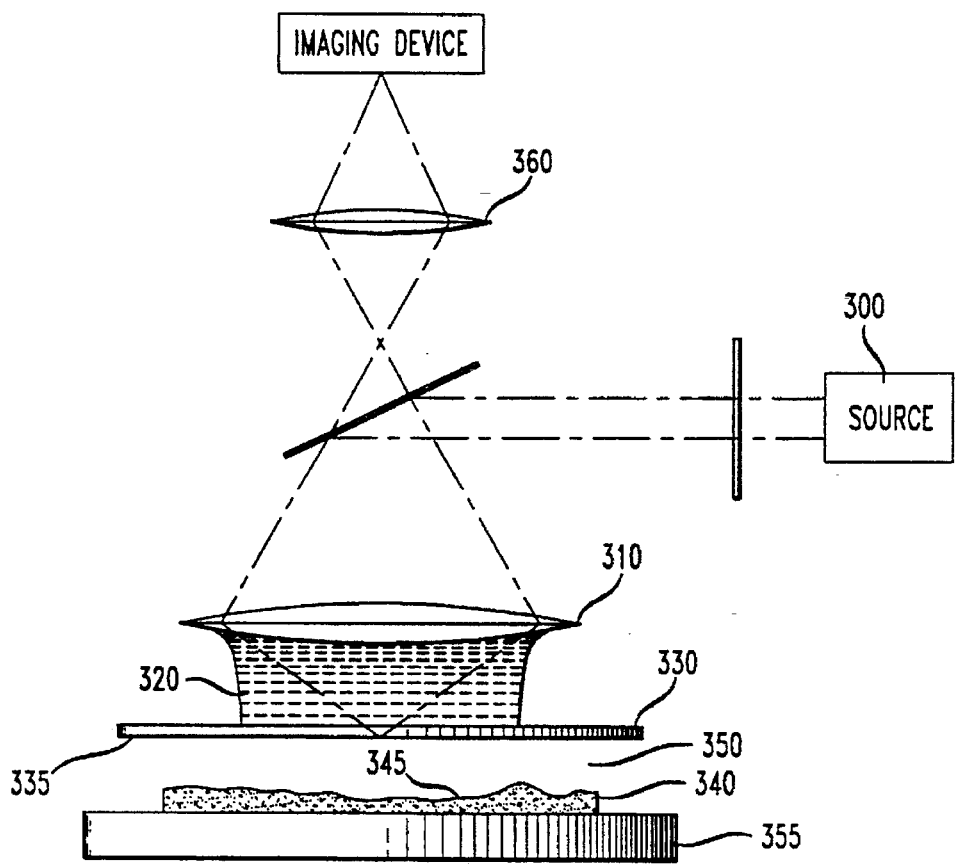
FIG. 5 is a schematic illustration of a PTM apparatus as it is used in the present process.

FIG. 5 is a schematic illustration of a PTM apparatus that is configured for use in the process of the present invention. In the PTM, light from a source 300 is transmitted through a lens 310 with a numerical aperture of at least about 1. It is advantageous if the numerical aperture is about 1.2 or more. The light is transmitted through a medium 320 such as oil. The light is then transmitted through a total internal reflection boundary or membrane 330. The focal point of the objective is the distal side 335 of this boundary or membrane 330. The surface 345 of the sample 340 is brought within the photon tunneling distance, typically about ¾ of a wavelength, of the distal side 335 of the boundary or membrane 330. The space 350 between the boundary and the sample is referred to as the tunneling gap. The sample 345 is moved relative to the objective 310 by a staging device 355. The evanescent decay of light that occurs at the distal side of the membrane 335 is detected for each point on the sample surface 345. This decay is effected by the topography and optical properties of the sample 340. Thus the measured decay of light at each point on the sample surface is a measure of the topography and optical properties of the sample at that point relative to the other points on the sample surface.

Figure 1:
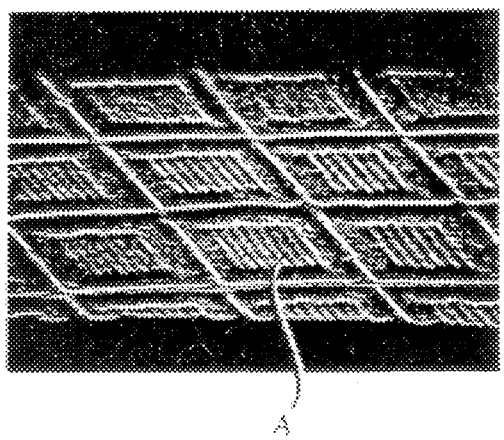
FIG. 1 is a photograph of a spatially resolved latent image used to practice the process of the present invention.

The amount of light reflected from the boundary or membrane 330 is a function of the topography and the index of refraction of the sample 340. The reflected intensity is mapped by the objective 310 and a camera or recording device (not shown). The spatially resolved image (FIG. 1) that is obtained is a map of the observed intensity of reflected light relative to the point on the sample surface where that intensity was observed. What appears as topography in FIG. 1 is actually an intensity map of the sample surface. The differences in shading are caused by differences in the refractive index of the material and the topography of the material over the surface of the sample.

Figure 6:
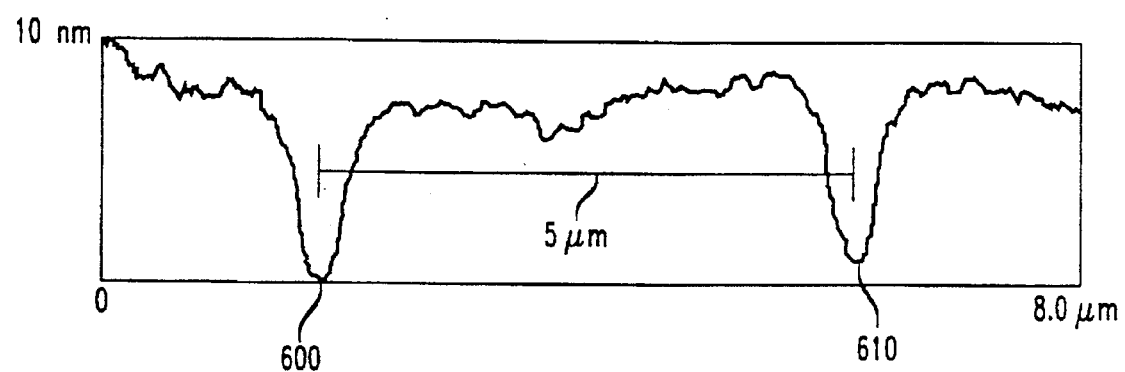
FIG. 6 is a topographic scan of the resist material from which the latent image in FIG. 1 was obtained.

FIG. 6 graphically depicts the topography of the sample in FIG. 1 along a line across the pattern in the bottom center grid of FIG. 1. For convenience, the grid is designated as "A" in FIG. 1. The topography was detected using an atomic force microscope (AFM), across the pattern along a line roughly parallel to the bottom of FIG. 1. The AFM topography of the latent image in the sample is shown in FIG. 6. The large dips in the line, 600 and 610, correspond to the edges of the grid. The AFM shows these edges to be less than 20 nm. The AFM shows very little topographic change between the edges of the grid. Therefore, the series of lines between the grids in FIG. 1 is primarily the result of the difference in refractive index between the exposed and unexposed portions of the resist material.

From a spatially resolved image of latent features in a resist material, such as the features in FIG. 1, the latent feature size is measured. If these latent features are introduced using different exposure conditions (e.g. focus, exposure dose), the exposure conditions that provide the desired feature size are selected prior to feature development. For example, the present invention is used to control the lithographic process by obtaining a correlation between a lithographic parameter such as exposure dose or bake time (at a set bake temperature) of the resist and a spatially resolved image of the latent feature that resulted from that parameter. This is accomplished by varying the parameter, e.g. exposure dose, and obtaining a spatially resolved image of the latent feature from each exposure dose. The latent features are then developed. In this manner, a correlation between exposure dose, latent image, and developed feature is obtained. During subsequent exposures, the image of the latent feature being introduced into the resist is obtained during exposure. When the latent image corresponds to the latent image that correlates to the desired developed feature, the exposure step is halted. This technique is not subject to variations in lamp intensity, because the exposure is only halted when the desired latent feature is obtained.

Furthermore, the effects of the lithographic exposure apparatus on the latent features are separable from the effects of the mask on the image using the process of the present invention. This is accomplished by first exposing a certain area of the resist to a uniform dose of radiation (i.e. a blanket exposure). Keeping the exposure conditions constant, a different region of the resist on the same wafer or a corresponding region of the resist on a different wafer is exposed to patterned radiation. A spatially resolved image of the latent features is obtained for both exposures. The images are then compared. If variations in intensity are observed in the blanket exposure, they are attributed to the optical properties of the exposure apparatus. These variations are then subtracted from the image of the patterned exposure. What remains is an image of the features provided by the mask. Any variations in this image that are not attributable to the optical properties of the exposure apparatus are attributed to the mask. By comparing blanket exposures with patterned exposures, the process of the present invention is thereby used to determine the optical properties of the exposure apparatus and the mask used to pattern the radiation, as well as to control the parameters of the lithographic process.

EXAMPLE 1

Latent feature formation over a 10 mm×10 mm field of a sample was characterized at a specific exposure dose using the process of the present invention. An energy sensitive resist composition was prepared by dissolving novolac resin (22 g; obtained from the Borden Chemical Co.), and an alternating copolymer of 2-methyl-1-pentene and sulfur dioxide (PMPS) (2.2 g) in ethyl 3-ethoxy propionate (100 ml). The resist composition was then spin-coated at 2000 rpm onto a silicon wafer (5" diameter wafer with a 100 crystallographic plane). A layer of the resist composition with a thickness of 0.65 µm was formed on the substrate. The coated silicon wafer was then baked in a forced air convection oven at 120° C. for 60 minutes.

A photon tunneling microscope (PTM) (Pegasus 1010 from Dyer Energy Systems) was used to scan certain areas of the film. The PTM was equipped with green or red light and a 100× oil immersion lens with a NA of 1.2. The area characterized by the PTM was defined by identifying the x-y coordinates on the wafer. The scan was used to map the topography and the refractive index of that defined area of the resist film.

The energy sensitive resist composition was then patternwise exposed to radiation using a pulsed laser point-source proximity print X-ray stepper (Hampshire Instruments, model 5000P). The exposure wavelength spectrum of the source was centered between 1.3 nm and 1.4 nm. The laser pulse rate was 1 HZ. The flux of the radiation at the plane of the wafer was in the range of 0.7 to 1 mJ/cm$^2$/pulse. The exposure field size was 10 mm×10 mm. The x-ray mask consisted of a 0.3 µm patterned tungsten layer on top of a 1 µm thick polysilicon membrane. The mask-to-wafer gripping distance was 30 µm. Exposure doses in the range of 10 to 60 mJ/cm$^2$, in increments of 10 mJ/cm$^2$ were used to introduce latent features into the energy sensitive resist.

Figure 7:
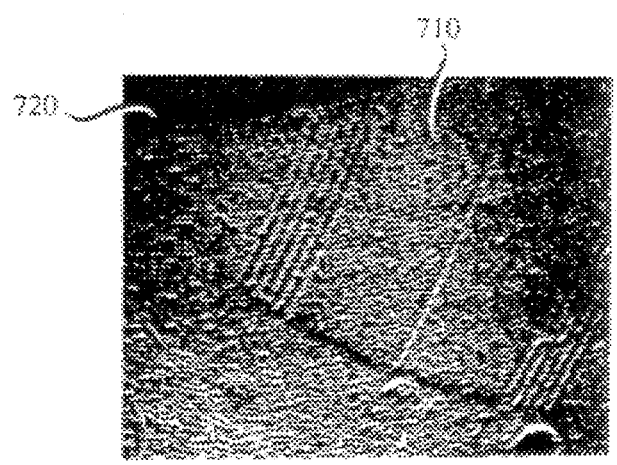
FIG. 7 is a latent image obtained by the present process.
Figure 8:
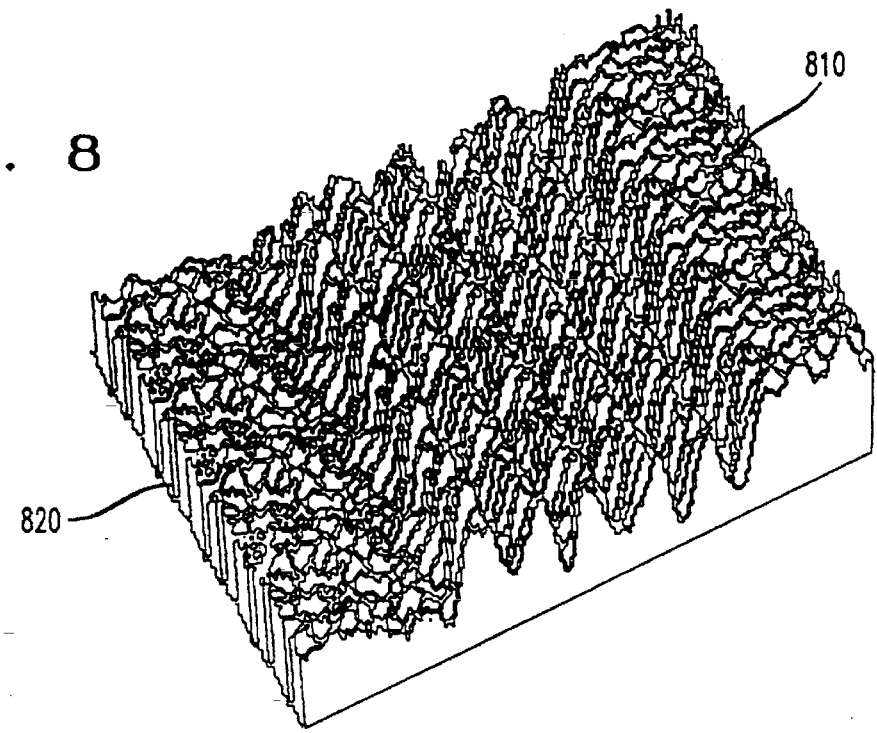
FIG. 8 is a topographic scan of the resist material from which the latent image in FIG. 7 was obtained.

The resist material was not baked after being exposed. The sample surface was rescanned by the PTM at the specified coordinates to obtain an image of the latent features introduced into the resist material at the various dosages. The spatially resolved image of a portion of the latent features obtained using an exposure dose of 60 mJ/cm$^2$ is illustrated in FIG. 7. The AFM topographic image of those same latent features is illustrated in FIG. 8. FIG. 8 demonstrates that a variation in surface topography height of less than 10 nm was between exposed region 810 and unexposed region 820. Regions 810 and 820 in FIG. 8 correspond to regions 710 and 720 in FIG. 7. Comparing the image in FIG. 7 with the AFM in FIG. 8, it is observed that minute changes in resist topography the result from exposing the resist to radiation are detected equally well by AFM and by the near-field imaging technique used in the process of the present invention.

EXAMPLE 2

A resist composition was prepared by dissolving a 2:1 copolymer of 4-t-butoxycarbonyloxystyrene and sulfur dioxide (12 g) in ethyl 3-ethoxy propionate (100 mL). The resulting solution was used to spin coat a film onto a silicon wafer (5" diameter) at a spin speed of 2000 rpm. The resulting film had a thickness of 0.7 µm. The resist coated substrate was baked on a hot plate at 105° C. for 2 minutes.

Figure 9A:
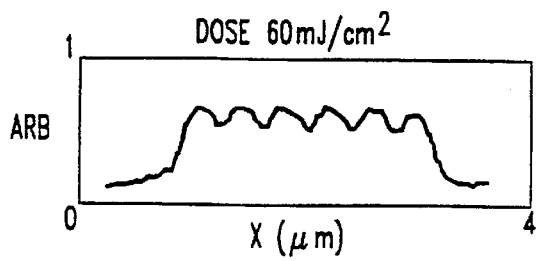
FIGS. 9A–9C are line scans of energy sensitive resist materials with latent features therein that, were made according to the present invention.
Figure 9B:
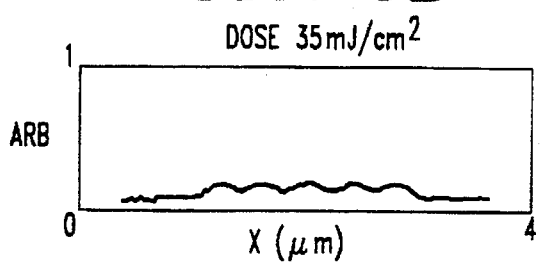
Figure 9C:
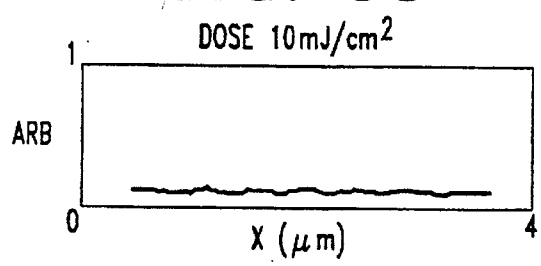
Figure 10A:
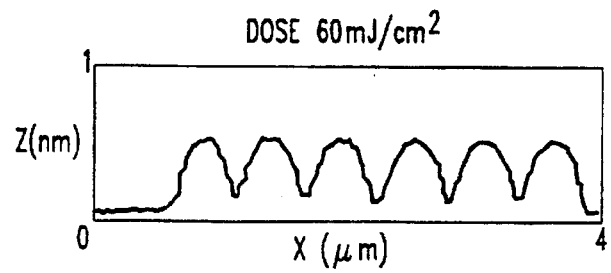
FIGS. 10A–10C are line scans of latent features that are the subject of FIG. 9, but which were obtained using an atomic force microscope.
Figure 10B:
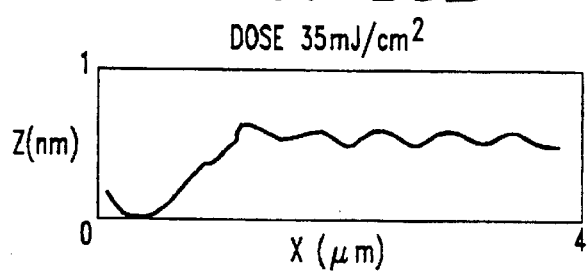
Figure 10C:
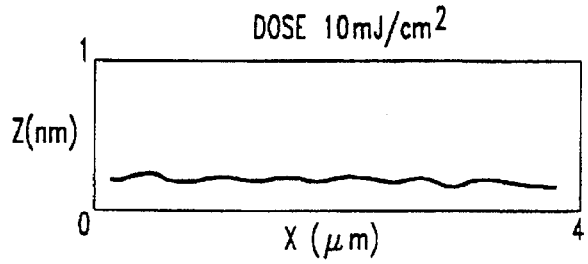

A mask that had a 1 µm-thick polysilicon membrane and a 0.3 µm-thick patterned tungsten x-ray absorber layer, wherein the pattern had 0.3 µm lines and spaces, was interposed between the sample and the source of the exposing X-ray radiation. The distance between the mask and wafer was 30 µm. Each field was exposed at a different X-ray dosage (10–60 mJ/cm$^2$ at dosage increments of 10 mJ/cm$^2$) and post-exposure baked (PEB), at 140° C. for 2.5 minutes on a hot plate, to determine changes in the latent image as a function of exposure dose and PEB conditions. The resulting latent features were then imaged by scanning 10 mm×10 mm fields using PTM and AFM apparatus as previously described. Line scans (a graph of relative intensity of the reflected signal on a line across the sample surface) of the latent feature of the pattern (actually measured to be 250 nm lines of 600 nm pitch) introduced with exposure dosages, of 60 mJ/cm², 30 mJ/cm² and 10 mJ/cm², obtained using a PTM, are illustrated in FIGS. 9a, 9b and 9c, respectively. Line scans of the same latent features were obtained using an AFM, are illustrated in FIGS. 10a–10c. There is a strong correlation between the PTM image and the AFM image at the high exposure dosage of 60 mJ/cm² (FIGS. 9a and 10a respectively). This is because, at high dosages, the detected difference between the unexposed region of the resist and the exposed region of the resist is primarily caused by the difference in topography between the exposed region and the unexposed region. At the 30 mJ/cm² exposure dosage, the differences in intensity of the signal from the exposed and unexposed portions of the resist are still detected by the PTM (FIG. 9b). These more subtle differences between the unexposed and exposed regions of the resist are not detected by the AFM (FIG. 10b), however. This indicates that the differences in intensity observed in the PTM-generated images were the result of differences in the refractive index of the exposed resist compared to the refractive index of the resist before it was exposed. It might also indicate that the PTM has greater sensitivity to topographic changes in the resist than the AFM.

The latent features introduced into the energy sensitive resist material using the various dosages of X-ray radiation previously described were then developed by immersing the energy sensitive resist material in a developer solution of tetramethylammonium hydroxide (TMAH) (0.17N solution) for 60 seconds. The resulting developed pattern was then rinsed by immersion in deionized water for 60 seconds. The wafer was then dried.

Figure 11:
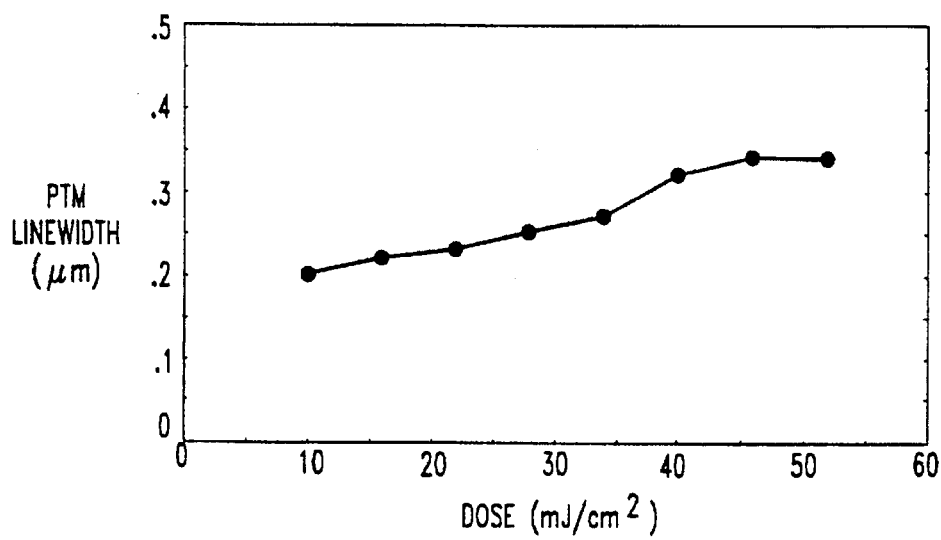
FIG. 11 is a graph of linewidth measurements obtained by the present process as a function of exposure dose.

The measured linewidths of the developed features at the various exposure doses are illustrated in FIG. 11. FIG. 11 illustrates that, to obtain the desired linewidth of 0.25 μm, the dosage should be 28 mJ/cm². Thus FIG. 11 illustrates that the feature size can be correlated to the dose. If correlations between latent feature size and dose and latent feature size and developed feature size are obtained, latent feature size can be monitored to control dose.

Figure 12:
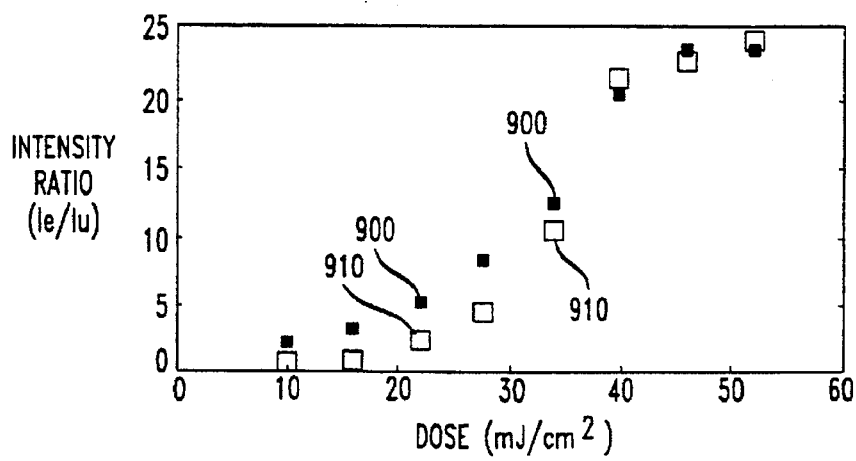
FIG. 12 is a graph of the intensity ratio of latent features in an energy sensitive material as a function of the dosage used to introduce the latent feature into the resist material.

FIG. 12 illustrates that dose can also be controlled by monitoring a parameter other than linewidth in the spatially resolved image. As illustrated in FIG. 12, at higher doses there is a higher ratio between the exposed resist intensity (Ie) and the unexposed resist intensity (Iu). FIG. 12 illustrates that, once the appropriate correlation is obtained in the manner described above, the dosage is controlled by monitoring the intensity in the spatially resolved image during the exposure step, and halting the exposure when the desired intensity is observed. The trend between intensity ratio and dose is about the same for PTM measurements 910 as they are for AFM measurements 910. However, the AFM-obtained intensity ratio 910 at lower doses is markedly lower than the PTM-obtained intensity ratio at these lower doses. This again indicates that the PTM is sensitive to changes in index of refraction of the resist while the AFM is not.

Figure 13:
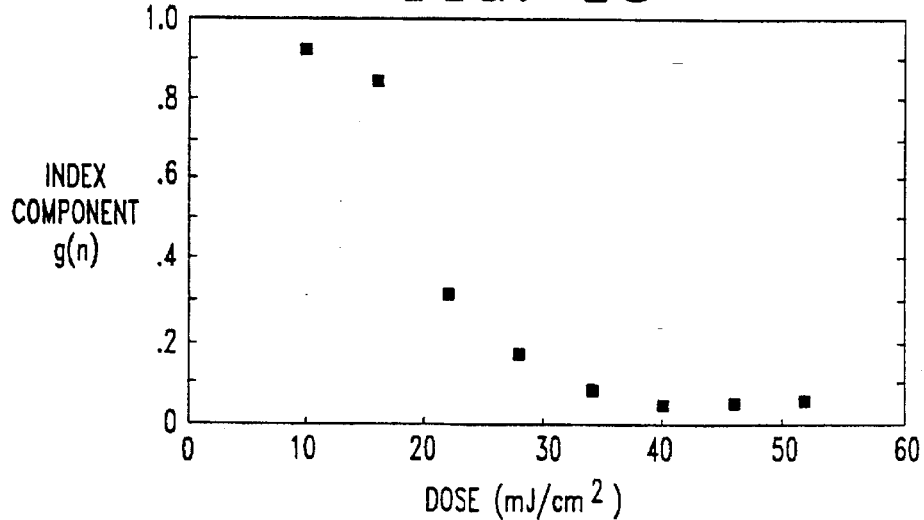
FIG. 13 is a graph of the index of refraction component of the intensity of latent features in an energy sensitive resist material as a function of the dosage used to introduce the latent feature into the resist material.

FIG. 13 illustrates yet another way in which the present process is used to control dose. The index component g(n) was determined by comparing the relative intensity of PTM-obtained image at a particular dose with an AFM-obtained image of a particular dose and dividing the intensity of the PTM-obtained image (which is assumed to be a product of a topographic component and an index component) with the intensity of the AFM-obtained image. Again, once the desired correlation is obtained between latent image index component, dose, and desired feature, the index component of spatially resolved images can be used to control dose during lithographic processes in the manner described above.

The process of the present invention provides a mechanism to adjust the exposure conditions should such an adjustment be required. First, the appropriate correlation is obtained between spatially resolved image, desired feature and exposure conditions. Then spatially resolved images are obtained during subsequent processing. These spatially resolved images are used to control the process step (e.g. exposure dose, post exposure bake conditions, i.e. time and temperature in real time, in real time.

Figure 14:
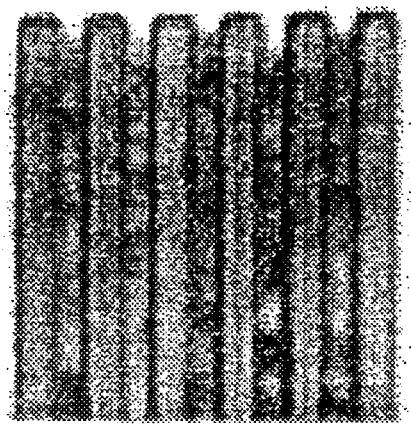
FIG. 14 is a spatially resolved image of a developed pattern in an energy sensitive material.

As illustrated in FIG. 14, fully developed lines and spaces can also be inspected by the process of the present invention. Using the inventive process, the trench bottoms in the developed pattern are observed. From this, one can assess whether the etching process is developing the pattern adequately, or if too much or too little material is being removed by the process.

We claim:

1. A process for fabricating a device comprising:

forming a layer of energy-sensitive resist material onto a substrate;

exposing at least a portion of the energy sensitive resist material to radiation, thereby introducing a latent feature into the energy sensitive resist material; and obtaining a spatially resolved image of the latent feature introduced into the energy sensitive resist material using a near-field imaging technique; and correlating the spatially resolved image to a parameter of the lithographic process for device fabrication.

2. The process of claim 1 wherein the energy sensitive resist material is exposed to radiation that has been patterned by projecting the radiation through a mask and the spatially resolved image is used to characterize the mask by comparing the spatially resolved image of at least one latent feature introduced into the resist by the patterned radiation with a spatially resolved image of an energy sensitive resist material exposed to radiation that is unpatterned, and determining the effects of the mask on the latent feature.

3. The process of claim 1 wherein a lithographic exposure tool is used to subject at least a portion of the energy sensitive resist material to a blanket exposure and, by observing the changes in intensity of the blanket exposure, characterize the lithographic exposure tool by attributing the variations in intensity to components of the stepper.

4. The process of claim 1 wherein the spatially resolved image of the latent feature is compared with a corresponding developed feature and the correlation is used to control lithographic parameters selected from the group consisting of lamp intensity, focus, exposure dose, source coherence, and post exposure bake time by observing the spatially resolved image of the latent feature during the relevant lithographic step and controlling the step based on the correlation between the latent feature and the desired developed feature.

5. The process of claim 4 wherein the exposure dose of the energy sensitive resist material are controlled by determining a correlation between the exposure dose and the spatially resolved image of a latent feature; determining a correlation between the spatially resolved image of the latent feature and a resulting developed feature; determining the spatially resolved image that corresponds to the desired developed feature, obtaining the spatially resolved image of latent features that are introduced during subsequent exposure steps, and controlling exposure dose by monitoring the spatially resolved image of the latent feature and halting the exposure when the obtained spatially resolved image corresponds to the desired developed feature.

6. The process of claim 1 wherein the energy sensitive resist material is exposed by interposing a mask between a source of radiation and the energy sensitive resist material, and projecting the radiation through the mask and onto the energy sensitive resist material thereby introducing a latent feature therein and wherein the mask is characterized by comparing the image of the latent feature with the mask and adjusting the exposure conditions to obtain the desired conformity between the mask and the latent feature.

7. The process of claim 4 wherein the post exposure baking step is controlled by determining a correlation between the baking time and the spatially resolved image of a latent feature; determining a correlation between the spatially resolved image of the latent feature and a resulting developed feature; determining the spatially resolved image that corresponds to the desired developed feature, obtaining the spatially resolved image of latent features that are introduced during during subsequent exposure steps, and controlling the baking time by monitoring the spatially resolved image of the latent feature and halting the bake step when the obtained spatially resolved image corresponds to the desired developed feature.

* * * * *